United States Patent [19]
Armacost et al.

[11] Patent Number: 5,622,596
[45] Date of Patent: Apr. 22, 1997

[54] HIGH DENSITY SELECTIVE $SiO_2$:$Si_3N_4$ ETCHING USING A STOICHIOMETRICALLY ALTERED NITRIDE ETCH STOP

[75] Inventors: Michael D. Armacost, Wallkill; David Dobuzinsky, Hopewell Junction, both of N.Y.; Jeffrey Gambino, Gaylordsville, Conn.; Son Nguyen, Hopewell Junction, N.Y.

[73] Assignee: International Business Machines Corporation, Armonk, N.Y.

[21] Appl. No.: 435,063

[22] Filed: May 8, 1995

[51] Int. Cl.$^6$ ........................................... H01L 21/31
[52] U.S. Cl. .............................. 438/702; 438/970; 216/39
[58] Field of Search ........................... 437/228 ES, 238, 437/241; 156/652.1, 653.1, 659.11

[56] References Cited

U.S. PATENT DOCUMENTS

| | | | |
|---|---|---|---|
| 4,367,119 | 1/1983 | Logan et al. | 156/643.1 |
| 4,447,824 | 5/1984 | Logan et al. | 257/774 |
| 4,543,707 | 10/1985 | Ito et al. | 437/228 |
| 5,443,998 | 8/1995 | Meyer | 437/241 |
| 5,468,987 | 11/1995 | Yamazaki et al. | 257/412 |
| 5,470,793 | 11/1995 | Kalnitsky | 437/241 |

FOREIGN PATENT DOCUMENTS

| | | |
|---|---|---|
| 0265584A2 | 5/1988 | European Pat. Off. . |
| 62-205645 | 9/1987 | Japan . |

*Primary Examiner*—John A. McPherson
*Attorney, Agent, or Firm*—Whitham, Curtis, Whitham & McGinn; Susan M. Murray, Esq.

[57] ABSTRACT

Selectivity of $SiO_2$ to $Si_3N_4$ is increased with the additional of silicon rich nitride conformal layer to manufacturing of semiconductor chip. Silicon rich nitride conformal layer may be used in place of or in addition to standard nitride conformal layers in manufacture.

5 Claims, 3 Drawing Sheets

5,622,596

HIGH DENSITY SELECTIVE $SiO_2:Si_3N_4$ ETCHING USING A STOICHIOMETRICALLY ALTERED NITRIDE ETCH STOP

BACKGROUND OF THE INVENTION

1. Field of the Invention

The present invention generally relates to semiconductor chip manufacture and, more particularly, to selective etching of $SiO_2$ to $Si_3N_4$ using a stoichiometrically altered nitride etch stop.

2. Background Description

Sub 0.5 μm Ultra Large Scale Integrated (ULSI) circuit applications require reactive ion etch (RIE) processes which will etch oxide highly selective to nitride. While this has been demonstrated on planar surfaces, stringent ground rules in advanced applications require high nitride selectivity over exposed corners. The most common example of this is where a diffusion contact overlaps a gate. Selectivities greater than 12 to 1 at the exposed corner of the gate are required to prevent leakage from the gate to the contact.

Selective oxide:nitride etch processes have been introduced, but these have required a delicate balance of polymer formation to ion energy control. These conditions are so sensitive to environmental fluctuations like nitride composition and uniformity that the process window becomes too small for manufacturing applications.

Thick nitride spacers on the edges of the device have been introduced to absorb any nitride erosion which may take place during the etch. This procedure, however, cannot be used in applications with very high packing densities.

SUMMARY OF THE INVENTION

It is therefore an object of the present invention to provide a means of enhancing the nitride selectivity at the corner of an exposed feature during an oxide etch process and reduce nitride corner erosion.

According to one aspect of the invention, an integrated circuit is prepared with a conformal layer of nitride as an etch stop. A nitride etch stop layer is deposited over a corner of the etch susceptible material. This nitride etch stop layer is characterized by a nitride formed stoichiometrically with the addition of a material that imparts improved etch selectivity over oxide. An oxide layer is deposited over the nitride layers, an aperture is patterned above the oxide, and then etching is performed though the oxide, stopping on the nitride layer without erosion. The nitride in the conformal layer is altered by increasing the concentration of silicon or by adding $Al_2O_3$ or $Y_2O_3$.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
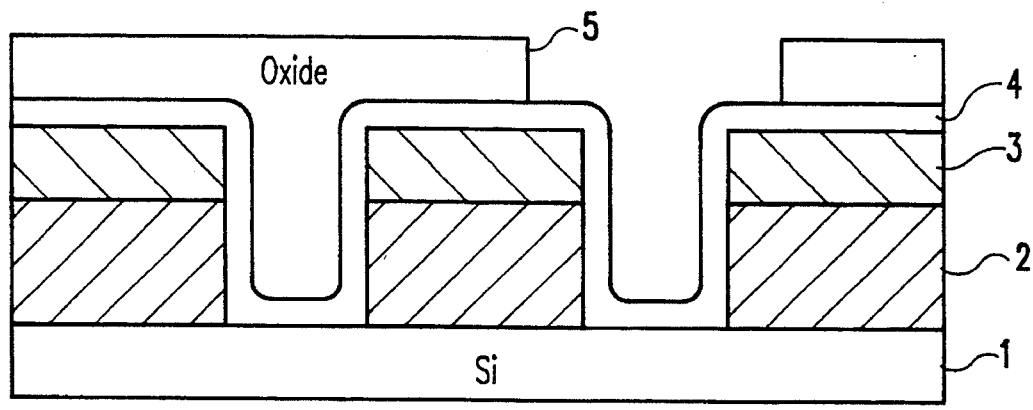
FIG. 1 is a cross section of a borderless contact structure after high selectivity oxide:nitride etch process and resist strip.

Referring now to the drawings, and more particularly to FIG. 1, there is shown a typical feature requiring high oxide to nitride selectivity, consisting of a silicon substrate 1 with gate electrodes 2, being about 2000–8000 Å in thickness. The gate electrodes 2 have a nitride cap 3, and electrodes and substrate are lined with a thin conformal nitride layer 4, which is usually between 100–1000 Å in thickness. These features are then filled with a dielectric 5, such as silicon dioxide, planarized, and patterned with photo resist and etched.

Figure 2:
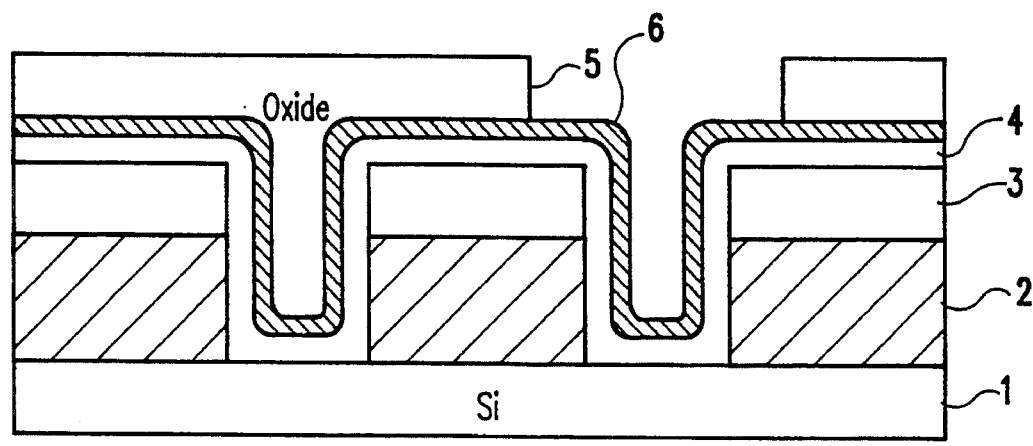
FIG. 2 is a cross section of a borderless contact structure as in FIG. 1 with the addition of the proposed altered film.

In the present invention, a stoichiometrically altered nitride layer as either all or part of the conformal nitride layer is introduced. As can be seen in FIG. 2, a feature having a silicon substrate 1 gate electrodes 2, cap 3 and conformal nitride 4 layers is constructed. An altered conformal nitride layer 6 is added. This structure can be constructed having the altered conformal nitride layer 6 replacing the first conformal nitride layer 4. This same type of altered nitride could additionally be included in the cap 3 of the gate electrode 2. This nitride layer consists of higher concentrations of some materials, such as silicon and hydrogen, which add substantial selectivity to the nitride film during the etch process, without substantially changing the dielectric properties of the material.

High selectivity oxide etch processes are commonly known throughout the semiconductor industry. Specifically, selectivities to silicon greater than 40:1 have been obtained on planar surfaces. These types of selectivities can be readily achieved in advanced etch systems, such as the AME Centura Oxide Etcher, because of their independent RF biasing, low pressure, and low fluorine content polymers when scavenging media are employed. High selectivity to polysilicon, for example, can even be obtained over topography for extended overetch times. This is noteworthy because when topography is introduced, ions impinging on exposed corners act to remove the deposited polymer, allowing sputtering of the polysilicon corner.

Processes which require conductive etch stops are not desired for manufacturing. These films present pathways for electrical shorts, and, in the case of silicon, attempts to oxidize the material away can lead to stress related failures. Therefore, a well known insulator, such as $Si_3N_4$, is an ideal type candidate for an etch stop.

Figure 3:
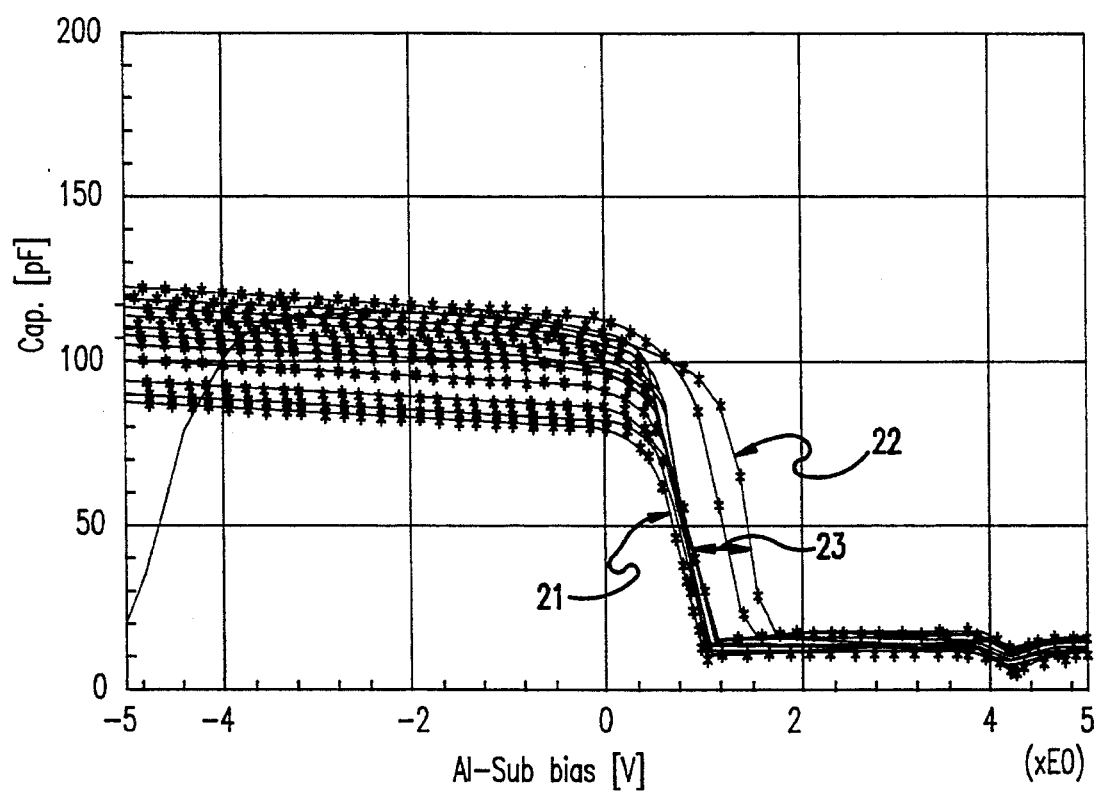
FIG. 3 is a graph of the capacitance-voltage curves for thin samples of silicon rich nitride having varying atomic percentages of silicon.
Figure 4:
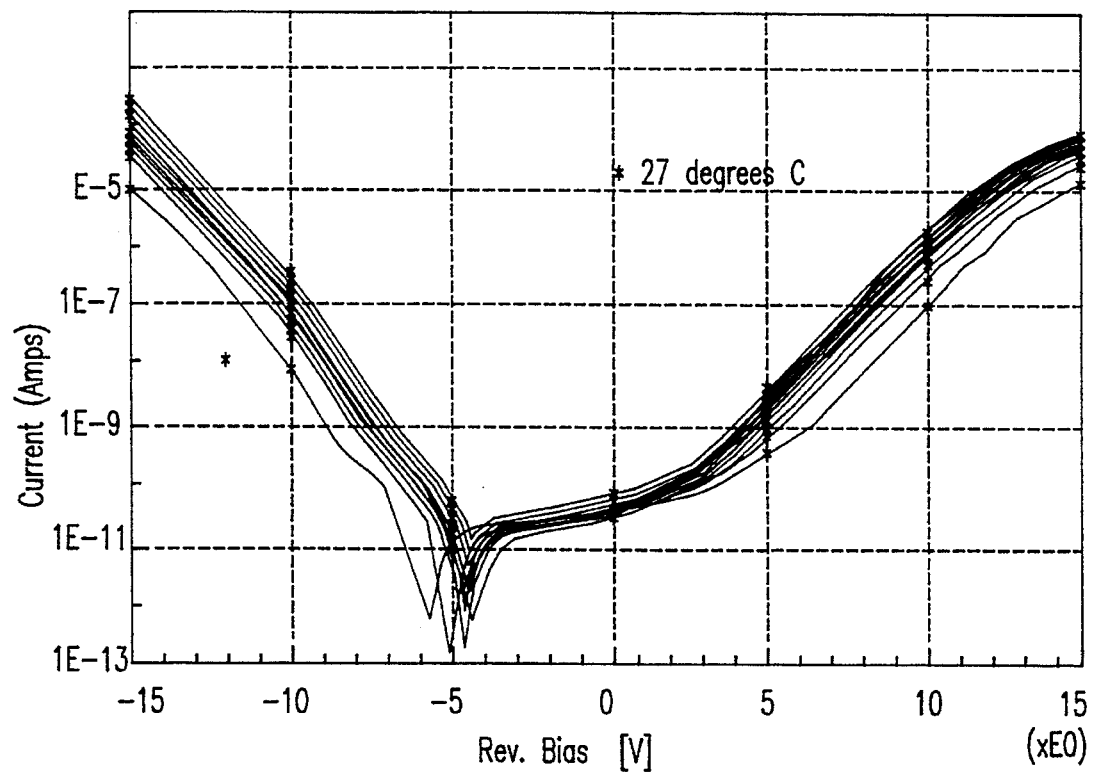
FIG. 4 is a graph of the current-voltage curves for thin samples of silicon rich nitride having varying atomic percentages of silicon.

Selective oxide:nitride etching over topography is difficult because the corner selectivity is extremely sensitive to ion bombardment. This sensitivity is greater than for polysilicon etch stops, resulting in a smaller process window. To increase the process window, the $Si_3N_4$ composition is altered such that it contains a higher percentage of silicon, in the range of 43.1 to 65 atomic percent. The material is insulating throughout this range as revealed by capacitance-voltage characteristics as is shown in the graph of FIG. 3. In this graph the bottom most curve 21 represents a sample having 43.1 atomic percent silicon and the top most curve 22 represents a sample having 67 atomic percent silicon. The stoichiometry can be monitored using the optical properties, in particular, the refractive index of the film. The refractive index for samples having 43 to 60% atomic percent of silicon ranged from 1.90 to 2.11. Samples having 65 to 67 atomic percent silicon had a refractive index of 2.20. A shift in capacitance-voltage is shown by arrow 23. This shift is due to charge trapping. However, charge trapping, which can have a detrimental effect on device stability, becomes more severe at the higher silicon levels as seen from the shift in capacitance-voltage characteristics, shown in the graph of FIG. 4. An increase in the shift of the capacitance-voltage characteristics corresponds to an increased amount of trapped charge. This curve represents samples having 43.1 to 67 atomic percent of silicon for a thin, between 300–400 Å, nitride, as well. Hence, the best concentration range for maximizing etch selectivity while minimizing conductivity is 50 to 60 atomic percent. Thus, while this nitride retains the insulator characteristics which will prevent shorts, it will also have the increased selectivity required for a manufacturable process.

Adjustment of the nitride stoichiometry is easily accomplished by adjusting the $SiH_4$ flow with respect to $NH_3$ or $N_2$ ratios during a Plasma Enhanced Chemical Vapor Deposition (PECVD) process. Concentrations ranging from about 50–60 atomic percent can be obtained in this manner with minimal process optimization. Stoichiometrically altered nitride films can also be deposited by sputtering or by other chemical vapor deposition processes or can be formed by ion implantation.

This technique, while demonstrated with silicon-rich nitride, can be expanded to include other types of selectivity enhancers. These may include hydrogen, which may act as a polymer source during the etch. Other known etch stop materials, such as $Al_2O_3$, or $Y_2O_3$, also can be incorporated into a nitride film by sputtering, CVD, or ion implantation, which will allow it to behave as a nitride, but have enough characteristics of the additive film to improve selectivity in an oxide etch chemistry.

This process adds minimal complexity. This stoichiometrically altered film can be added on top of the existing LPCVD nitride, or, if reliability is acceptable, can be used as the sole etch stop, requiring no additional process steps.

Additionally, this invention is desirable because it means implementation of a borderless contact process is dependent on a controlled feature, not the etch process alone. While high density plasma etching may be critical to etch high aspect ratios and obtain selectivity to nitride on plana surfaces, it is not in itself a means to obtain a borderless contact.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of etching an aperture in an oxide layer, where the oxide layer is deposited over a nitride layer that is used as an etch stop, said nitride layer covering a corner over a lower etch susceptible material comprising the steps of:

depositing a nitride etch stop layer over the etch susceptible material, the nitride etch stop layer comprising silicon at greater than 50 to 65 atomic percent;

depositing an oxide layer over the nitride etch stop layer;

patterning an aperture above the oxide layer; and etching through the oxide layer, stopping on the nitride etch stop layer.

2. A method as in claim 1 wherein said silicon in said nitride etch stop layer is greater than 50 to 60 atomic percent.

3. A method of etching an aperture in an oxide layer, where the oxide layer is deposited over a nitride layer that is used as an etch stop, said nitride layer covering a corner over a lower etch susceptible material comprising the steps of:

depositing a nitride etch stop layer over the etch susceptible material, the nitride etch stop layer being a nitride that is modified with a modifying material selected from the group consisting of hydrogen, $Al_2O_3$, and $Y_2O_3$;

depositing an oxide layer over the nitride etch stop layer;

patterning an aperture above the oxide layer; and etching through the oxide layer, stopping on the nitride etch stop layer.

4. A method as in claim 3 wherein said modifying material added to said nitride is $Al_2O_3$.

5. A method as in claim 3 wherein said modifying material added to said nitride is $Y_2O_3$.

\* \* \* \* \*